(12) United States Patent
Kai et al.

(10) Patent No.: US 8,883,642 B2
(45) Date of Patent: Nov. 11, 2014

(54) METHOD OF MANUFACTURING SEMICONDUCTOR DEVICE AND SEMICONDUCTOR MANUFACTURING APPARATUS

(71) Applicant: Kabushiki Kaisha Toshiba, Tokyo (JP)

(72) Inventors: Wakana Kai, Yokohama (JP); Tomonori Aoyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/779,981

(22) Filed: Feb. 28, 2013

(65) Prior Publication Data
US 2013/0280911 A1    Oct. 24, 2013

(30) Foreign Application Priority Data
Apr. 20, 2012  (JP) .................................. 2012-96735

(51) Int. Cl.
  *H01L 21/302*  (2006.01)
  *H05B 6/80*  (2006.01)
  *H01L 21/306*  (2006.01)
  *H05B 6/64*  (2006.01)

(52) U.S. Cl.
  CPC ............ *H01L 21/30604* (2013.01); *H05B 6/80* (2013.01); *H05B 6/6473* (2013.01)
  USPC ............. 438/689; 438/690; 438/691; 216/37; 257/752; 257/758; 257/776

(58) Field of Classification Search
  USPC ............. 438/689–691; 216/37; 257/758, 752, 257/776
  See application file for complete search history.

(56) References Cited

U.S. PATENT DOCUMENTS

| | | | |
|---|---|---|---|
| 6,261,883 B1 * | 7/2001 | Koubuchi et al. | ............. 438/197 |
| 7,351,656 B2 | 4/2008 | Sakata et al. | |
| 7,791,202 B2 | 9/2010 | Sakata et al. | |
| 7,902,036 B2 | 3/2011 | Yamada | |
| 7,994,054 B2 | 8/2011 | Sakata et al. | |
| 8,148,274 B2 | 4/2012 | Wada et al. | |
| 2006/0214305 A1 | 9/2006 | Sakata et al. | |
| 2008/0090410 A1 | 4/2008 | Sakata et al. | |
| 2008/0122102 A1 | 5/2008 | Sakata et al. | |
| 2008/0261398 A1 | 10/2008 | Sakata et al. | |
| 2010/0155791 A1 | 6/2010 | Yamada | |
| 2012/0152168 A1 | 6/2012 | Sakata et al. | |
| 2012/0225498 A1 * | 9/2012 | Aoyama et al. | ................... 438/3 |

FOREIGN PATENT DOCUMENTS

| | | |
|---|---|---|
| JP | 4-338644 | 11/1992 |
| JP | 2010-258057 | 11/2010 |
| JP | 2011-66052 | 3/2011 |
| JP | 2011-69501 | 4/2011 |

* cited by examiner

*Primary Examiner* — Duy Deo
*Assistant Examiner* — Maki Angadi
(74) *Attorney, Agent, or Firm* — Finnegan, Henderson, Farabow, Garrett & Dunner, L.L.P.

(57) ABSTRACT

In one embodiment, a method of manufacturing a semiconductor device includes forming a concave portion on a surface of a substrate to be processed. The method further includes forming a coating film on the substrate to embed the coating film in the concave portion. The method further includes performing a first heat treatment in an atmosphere including an oxidant which contains polar molecules. The method further includes performing a second heat treatment after the first heat treatment by irradiating the coating film with a microwave after or while exposing the coating film to a liquid or a gas containing polar molecules.

11 Claims, 10 Drawing Sheets

METHOD OF MANUFACTURING SEMICONDUCTOR DEVICE AND SEMICONDUCTOR MANUFACTURING APPARATUS

CROSS REFERENCE TO RELATED APPLICATION

This application is based upon and claims the benefit of priority from the prior Japanese Patent Application No. 2012-96735, filed on Apr. 20, 2012, the entire contents of which are incorporated herein by reference.

FIELD

Embodiments described herein relate to a method of manufacturing a semiconductor device and a semiconductor manufacturing apparatus.

BACKGROUND

In recent years, it has been considered to form isolation insulators from a coating film such as a polysilazane (PSZ) film. The coating film has an advantage that it can be reliably filled in isolation trenches having narrow widths and high aspect ratios. When the isolation insulators are formed from the coating film, it is necessary to oxidize and cure the coating film by a heat treatment after forming the coating film. However, the stress in the polysilazane film is largely varied due to film shrinkage in the heat treatment, so that such large cracks as to extend to a semiconductor substrate may be generated in the polysilazane film. Accordingly, to prevent the generation of the cracks, a method of conducting the heat treatment of the polysilazane film at a temperature as low as possible to reduce the stress in the polysilazane film has been studied. However, there is a problem that the oxidation of the polysilazane film is insufficient at low temperature, so that only the isolation insulators poor in insulation performance can be obtained.

DETAILED DESCRIPTION

Embodiments will now be explained with reference to the accompanying drawings.

In one embodiment, a method of manufacturing a semiconductor device includes forming a concave portion on a surface of a substrate to be processed. The method further includes forming a coating film on the substrate to embed the coating film in the concave portion. The method further includes performing a first heat treatment for heating the coating film in an atmosphere including an oxidant which contains polar molecules. The method further includes performing a second heat treatment after the first heat treatment for heating the coating film by irradiating the coating film with a microwave after or while exposing the coating film to a liquid or a gas containing polar molecules.

(First Embodiment)

Figure 1:
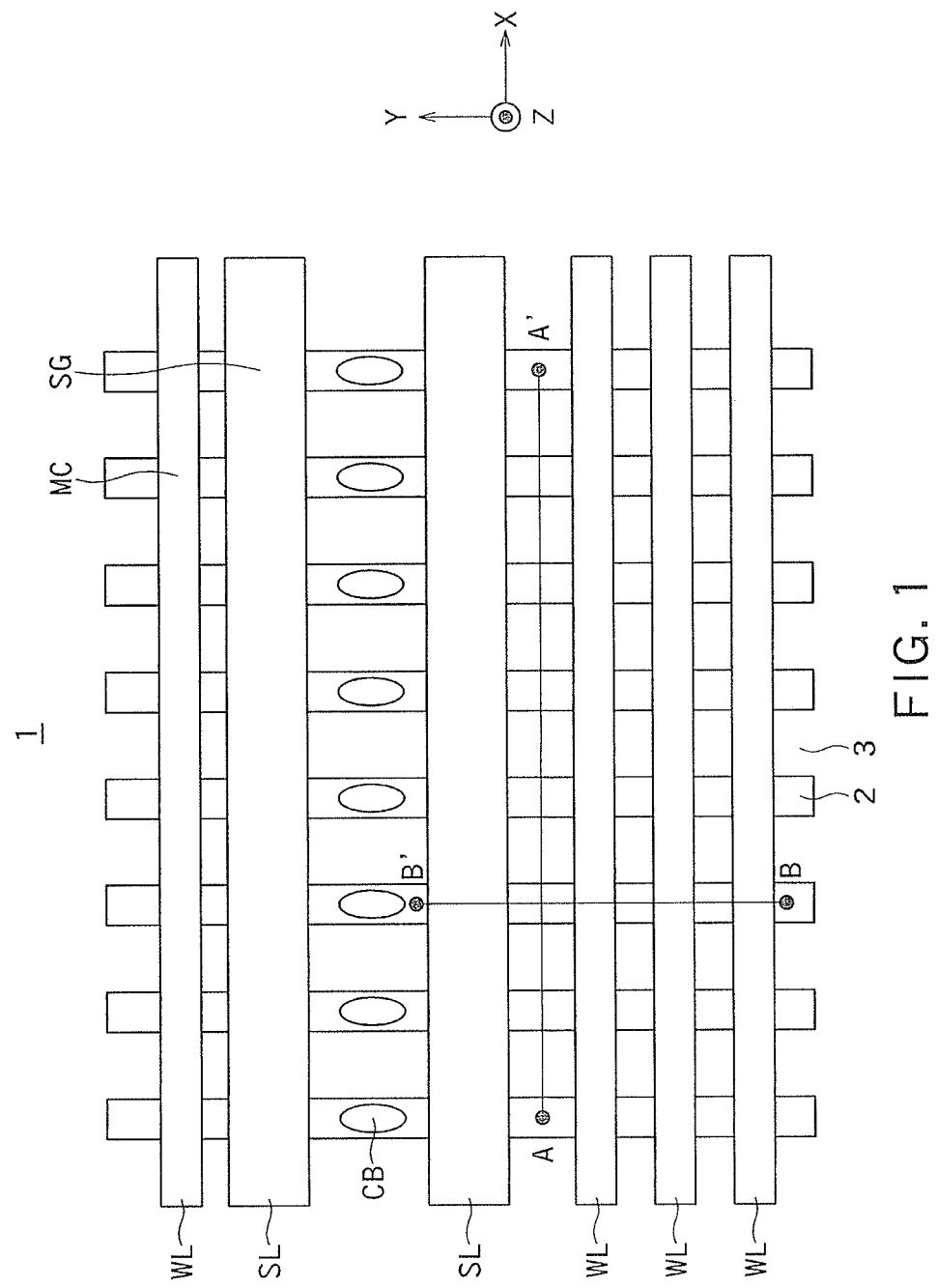
FIG. 1 is an example of a plan view showing a structure of a semiconductor device of a first embodiment.

FIG. 1 is an example of a plan view showing a structure of a semiconductor device of a first embodiment. The semiconductor device in FIG. 1 is a NAND flash memory.

The semiconductor device in FIG. 1 includes a semiconductor substrate 1, device regions 2, isolation insulators 3, word lines WL, select lines SL, bit line contacts CB, memory cell transistors MC and select gate transistors SG.

The semiconductor substrate 1 is, for example, a silicon substrate. FIG. 1 shows X and Y directions which are parallel to a main surface of the semiconductor substrate 1 and perpendicular to each other, and a Z direction which is perpendicular to the main surface of the semiconductor substrate 1.

The device regions 2 are formed in the semiconductor substrate 1, and isolated from one another by the isolation insulators 3. The isolation insulators 3 are embedded in isolation trenches formed on the surface of the semiconductor substrate 1. The device regions 2 and the isolation insulators 3 extend in parallel in the Y direction, and are alternately arranged along the X direction. Each device region 2 is also called an active area (AA). Each isolation insulator 3 is also called a shallow trench isolation (STI). The isolation insulators are, for example, silicon oxide films formed from a polysilazane film.

The word lines WL and the select lines SL extend in parallel in the X direction, and cross the device regions 2 and the isolation insulators 3. The memory cell transistors MC are formed at intersections of the word lines WL and the device regions 2. The select gate transistors SG are formed at intersections of the select lines SL and the device regions 2. Each bit line contact CB is arranged on a device region 2 between a pair of select lines SL, and electrically connected to a bit line (not shown) above the device region 2.

Figure 2A:
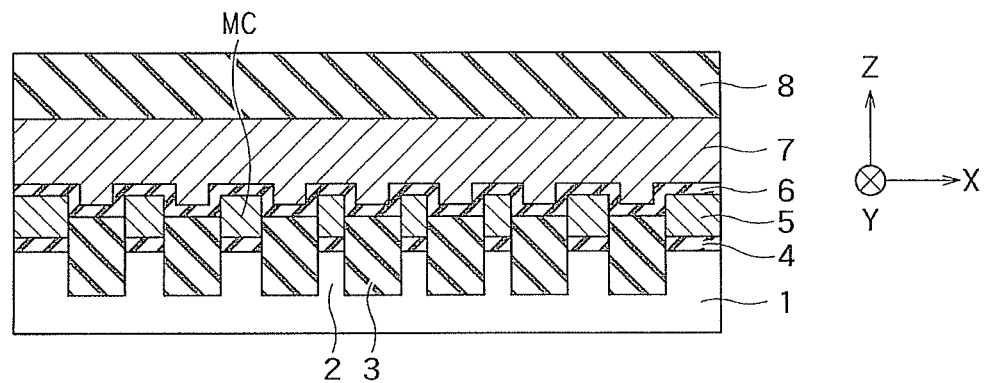
FIGS. 2A and 2B are an example of sectional views showing the structure of the semiconductor device of the first embodiment.
Figure 2B:
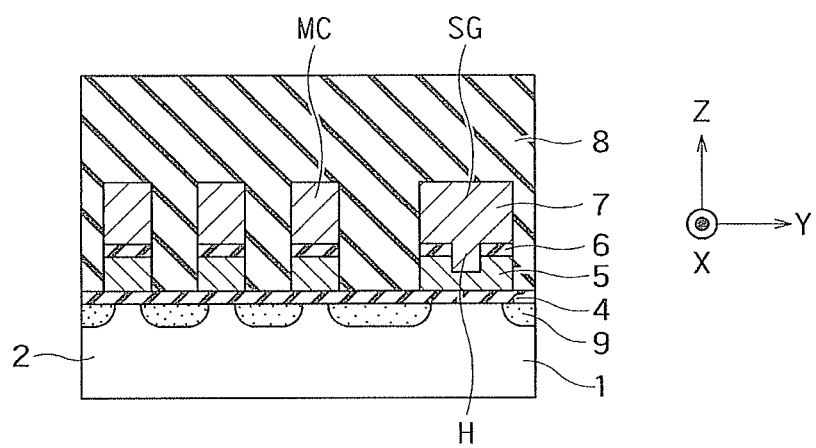

FIGS. 2A and 2B are an example of sectional views showing the structure of the semiconductor device of the first embodiment. FIGS. 2A and 2B are the sectional views taken along lines A-A' and B-B' in FIG. 1, respectively.

As shown in FIGS. 2A and 2B, the semiconductor device of this embodiment includes the semiconductor substrate 1, the device regions 2, the isolation insulators 3, a first insulating layer 4, a first electrode layer 5, a second insulating layer 6, a second electrode layer 7, an inter layer dielectric 8 and diffusion layers 9.

The first insulating layer 4 and the first electrode layer 5 are sequentially formed on the device regions 2. The first insulating layer 4 and the first electrode layer 5 of each memory cell transistor MC function as a gate insulator and a floating gate, respectively. The first insulating layer 4 is, for example, a silicon oxide film. The first electrode layer 5 is, for example, a polysilicon layer.

The second insulating layer 6 and the second electrode layer 7 are sequentially formed on the first electrode layer 5 and the isolation insulator 3. The second insulating layer 6 and the second electrode layer 7 of each memory cell transistor MC function as an intergate insulator and a control gate, respectively. The second insulating layer 6 is, for example, an ONO stack film formed by sequentially stacking a first silicon oxide film, a silicon nitride film and a second silicon oxide film. The second electrode layer 7 is, for example, a polysilicon layer. The word lines WL and the select lines SL in FIG. 1 are formed of the second electrode layer 7.

In each select gate transistor SG, the first and second electrode layers 5 and 7 are electrically connected by an opening H provided in the second insulating layer 6. The first insulating layer 4 of each select gate transistor SG functions as a gate insulator, and the first and second electrode layers 5 and 7 of each select gate transistor SG each function as a gate electrode.

The inter layer dielectric 8 is formed on the semiconductor substrate 1 so as to cover the memory cell transistors MC and the select gate transistors SG. The diffusion layers 9 are formed in the semiconductor substrate 1 so as to sandwich the memory cell transistors MC and the select gate transistors SG. The inter layer dielectric 8 in FIGS. 2A and 2B includes, in addition to a usual inter layer dielectric, insulating layers such as a liner layer and a cap layer embedded in spaces between these transistors MC and SG.

(1) Method of Manufacturing Semiconductor Device of First Embodiment

An example of a method of manufacturing the semiconductor device of the first embodiment will be described with reference to FIGS. 3A to 6C.

FIGS. 3A to 6C are an example of sectional views showing the method of manufacturing the semiconductor device of the first embodiment.

Figure 3A:
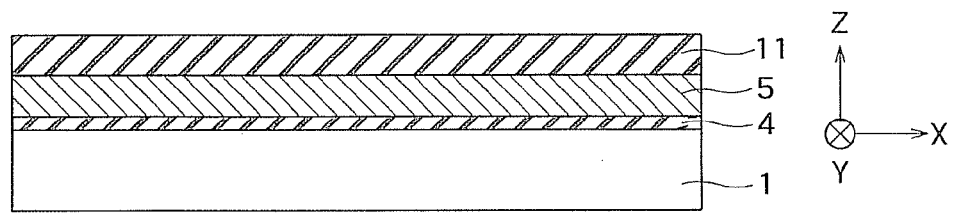
FIGS. 3A to 6C are an example of sectional views showing a method of manufacturing the semiconductor device of the first embodiment.

As shown in FIG. 3A, the first insulating layer 4, the first electrode layer 5 and a hard mask layer 11 are sequentially formed on the semiconductor substrate 1. The first insulating layer 4 is formed by, for example, thermal oxidation. The first electrode layer 5 is formed by, for example, adding impurities by low pressure chemical vapor deposition (LPCVD). The hard mask layer 11 is, for example, a silicon nitride film. The hard mask layer 11 is used as a hard mask for etching and as a stopper for chemical mechanical polishing (CMP). A substrate including the semiconductor substrate 1 and the first insulating layer 4, the first electrode layer 5 and the hard mask layer 11 formed on the semiconductor substrate 1 is an example of a substrate to be processed in the disclosure.

Figure 3B:
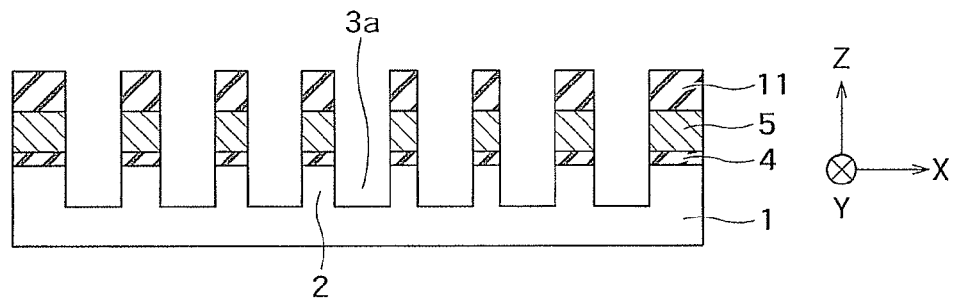

As shown in FIG. 3B, isolation trenches 3a are formed on the surface of the substrate by photolithography and reactive ion etching (RIE). The isolation trenches 3a are an example of a concave portion of the disclosure. The isolation trenches 3a are formed to penetrate the hard mask layer 11, the first electrode layer 5 and the first insulating layer 4 to etch the semiconductor substrate 1 to a predetermined depth.

Figure 3C:
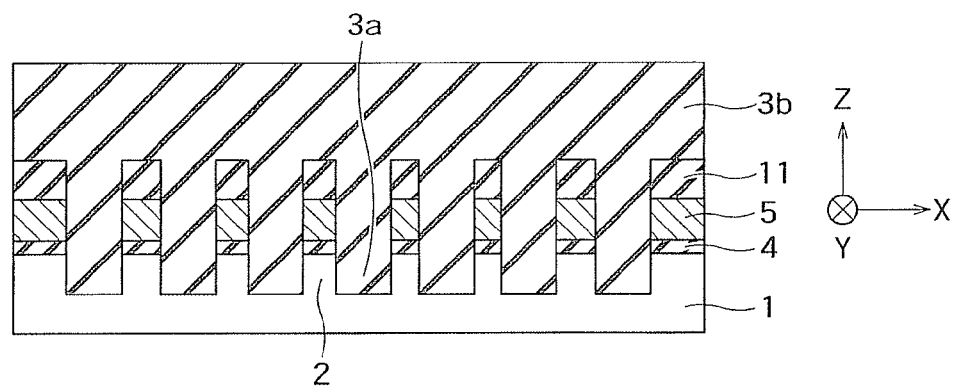

As shown in FIG. 3C, a polysilazane film 3b is formed on the entire surface of the semiconductor substrate 1 to embed the polysilazane film 3b in the isolation trenches 3a. The polysilazane film 3b is an example of a coating film of the disclosure.

The polysilazane film 3b can be formed by the following procedure. A polysilazane coating solution (PSZ coating solution) is first applied onto the entire surface of the semiconductor substrate 1 by spin coating or the like. The polysilazane coating solution is specifically a solution containing a perhydrogenated silazane polymer (chemical formula is $(SiH_2NH)_n$) (perhydrogenated silazane solution). The thickness of the polysilazane film 3b immediately after the coating is set at, for example, about 500 nm. A baking treatment of the polysilazane coating solution is then performed. As a result, a remaining solvent in the polysilazane film 3b is volatilized, so that a hardened polysilazane film 3b is obtained. In the baking treatment, the polysilanane coating solution is heated by a hot plate at 150° C. for about 3 minutes, for example.

Figure 4A:
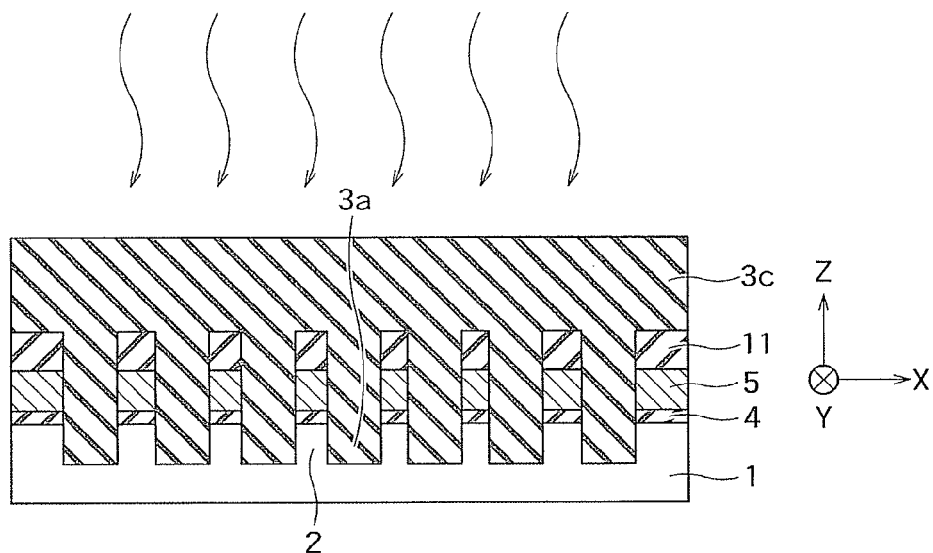

As shown in FIG. 4A, a heat treatment is performed. As a result, the polysilazane film 3b is oxidized and cured, so that a silicon oxide film 3c is obtained from the polysilazane film 3b.

In this embodiment, the heat treatment in FIG. 4A is performed by the following procedure.

[First Heat Treatment]

First, a first heat treatment is performed in an atmosphere including water vapor. In the first heat treatment, for example, lamp annealing or laser annealing is performed. In the first heat treatment, the temperature is at, for example, 200 to 400° C. (for example 280° C. or 300° C.).

The first heat treatment is performed for stabilizing quality of the polysilazane film 3b. In this embodiment, since the first heat treatment is performed at 400° C. or lower, bonds of silicon and nitrogen (Si—N), bonds of silicon and hydrogen (Si—H) and bonds of nitrogen and hydrogen (N—H) are left in the polysilazane film 3b after the first heat treatment, and the polysilazane film 3b is not yet changed into the silicon oxide film 3c. In other words, it is described that the first heat treatment is performed by use of an oxidant containing polar molecules. The first heat treatment may be performed in an atmosphere including a gas, other than water vapor, which functions as an oxidant for the polysilazane film 3b. The oxidant may contain polar molecules other than water molecules.

[Dipping Treatment]

Next, the semiconductor substrate 1 is dipped in a liquid such as hot water or a chemical liquid containing sulfuric acid and hydrogen peroxide. As a result, the polysilazane film 3b is caused to contain water molecules. The water molecules are an example of the polar molecules of the disclosure. The surface of the polysilazane film 3b is then dried to such a degree that the water molecules are left in the polysilazane film 3b.

If this dipping treatment is performed without the first heat treatment, the polysilazane film 3b may be dissolved. Accordingly, in this embodiment, the dipping treatment is performed after the first heat treatment. Either hot water or cool water may be used for the dipping treatment, but the use of hot water has such an advantage that the polysilazane film 3b easily absorbs water as compared to the use of cool water.

[Second Heat Treatment]

Next, the polysilazane film 3b containing the water molecules is irradiated with a microwave to perform a second heat treatment. The microwave is defined as an electromagnetic wave having a frequency of 300 MHz to some GHz. In the second heat treatment, the microwave of 5.80 GHz is applied with a power of 10 to 1000 W/cm$^2$ for 30 seconds to 60 minutes while passing a $N_2$ or $O_2$ gas at 5 to 50 Slm, for example. In the second heat treatment, the polysilazane film 3b is heated at, for example, 200 to 500° C. (for example 430° C.).

Since the water molecules are polar molecules, application of the microwave to the polysilazane film 3b causes rotational oscillation of the water molecules, so that hydrolysis of the polysilazane film 3b is generated. Therefore, according to the second heat treatment, the oxidation reaction of a polysilazane film 3b can be advanced efficiently. As a result of the second heat treatment, a good silicon oxide film 3c is obtained from the polysilazane film 3b.

Generally, for sufficiently oxidizing the polysilazane film 3b only by the first heat treatment, it is necessary to heat the polysilazane film 3b at 500° C. or higher. On the other hand, according to the second heat treatment of this embodiment, the oxidization reaction of the polysilazane film 3b can be made to proceed efficiently, and therefore by the second heat treatment at 500° C. or lower, the polysilazane film 3b can be more sufficiently oxidized than by the first heat treatment at 500° C. or higher. Actually, the present inventors analyzed residual impurities in the polysilazane film 3b, and found that the amount of the residual impurities (nitrogen, hydrogen and the like) when performing the first and second heat treatments at 500° C. or lower was smaller than the amount of the residual impurities when performing only the first heat treatment at 500° C. or higher.

Therefore, according to this embodiment, necessity of heating the polysilazane film 3b at high temperature is eliminated, so that generation of such large cracks as to extend to the semiconductor substrate 1 in the polysilazane film 3b can be suppressed. According to this embodiment, the polysilazane film 3b can be sufficiently oxidized even at low temperature, and therefore the silicon oxide film 3c excellent in insulation performance can be formed by a heat treatment at a low temperature.

The second heat treatment may be performed in such a state that the polysilazane film 3b contains polar molecules other than the water molecules. As an example of such a polar molecule, a polar molecule containing an oxygen atom (for example, an ozone molecule or a hydrogen peroxide molecule) is mentioned.

Subsequently, a step of FIG. 4B and subsequent steps will be described.

Figure 4B:
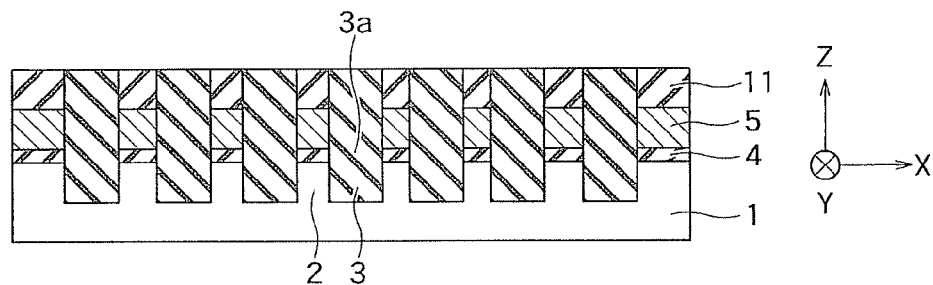

As shown in FIG. 4B, the surface of the silicon oxide film 3c is planarized by CMP using the hard mask layer 11 as a stopper. As a result, the isolation insulators 3 are formed in individual isolation trenches 3a.

Figure 4C:
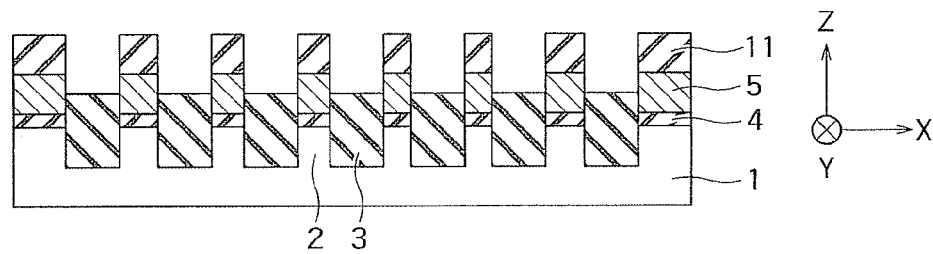

As shown in FIG. 4C, the height of the upper surface of the isolation insulators 3 is lowered by etch-back. In this embodiment, the height of the upper surface of the isolation insulators 3 is lowered to a height between the upper and lower surfaces of the first electrode layer 5.

Figure 5A:
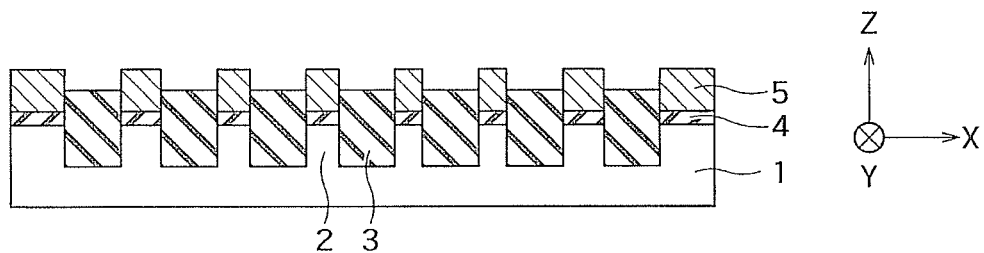
Figure 5B:
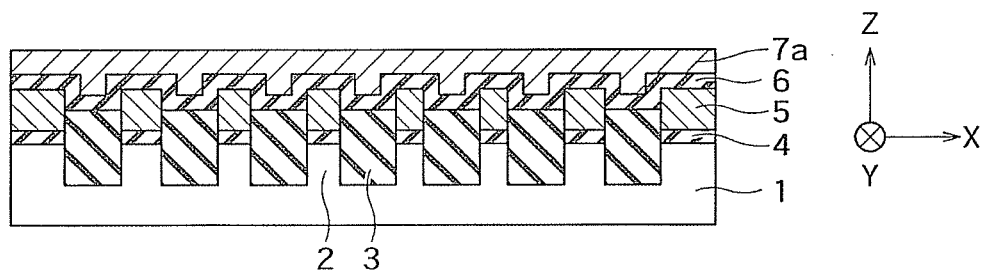
Figure 5C:
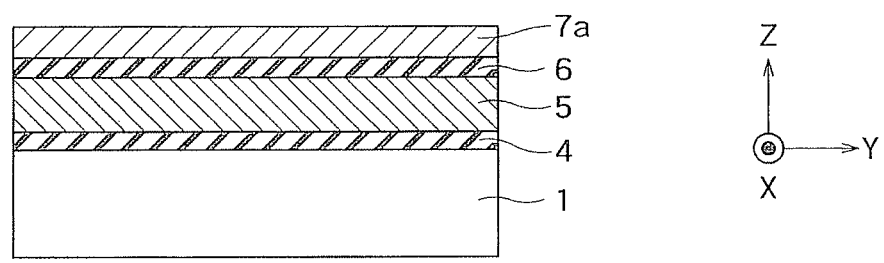

As shown in FIG. 5A, the hard mask layer 11 is removed. As shown in FIG. 5B, the second insulating layer 6 and an underlying layer 7a of the second electrode layer 7 are sequentially formed on the entire surface of the semiconductor substrate 1. FIG. 5C is a sectional view obtained by cutting the semiconductor device at the processing time shown in FIG. 5B along line B-B' of FIG. 1.

Figure 6A:
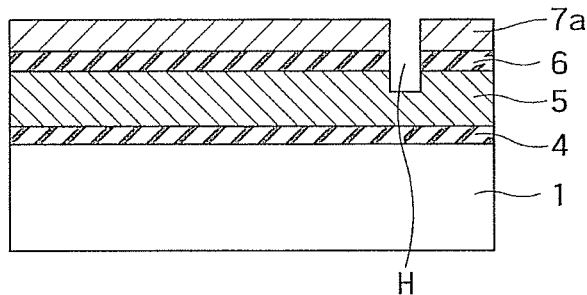

As shown in FIG. 6A, the opening H penetrating the underlying layer 7a of the second electrode layer 7 and the second insulating layer 6 is formed by photolithography and RIE. The opening H is formed in a region on which the select gate transistor SG is to be formed.

Figure 6B:
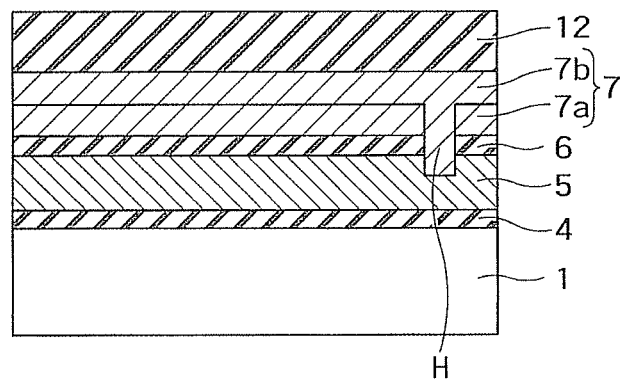

As shown in FIG. 6B, an overlying layer 7b of the second electrode layer 7 and a hard mask layer 12 are sequentially formed on the entire surface of the semiconductor substrate 1. As a result, the overlying layer 7b of the second electrode layer 7 is embedded in the opening H.

Figure 6C:
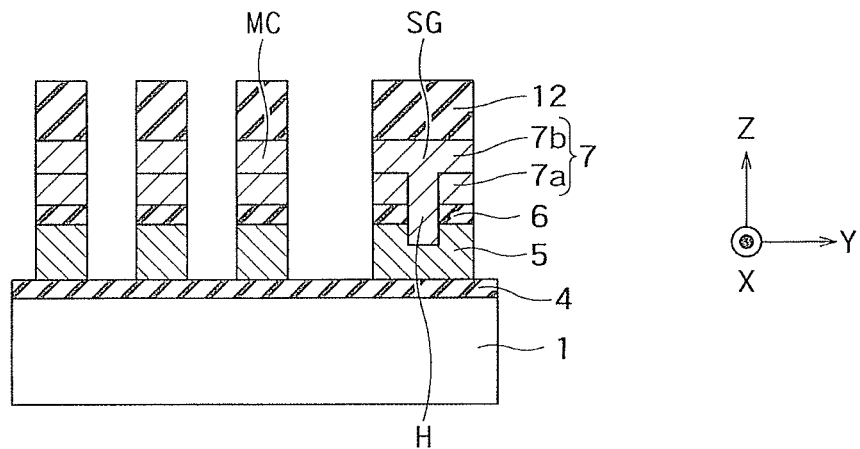

As shown in FIG. 6C, the hard mask layer 12, the second electrode layer 7, the second insulating layer 6 and the first electrode layer 5 are processed by photolithography and RIE. As a result, as shown in FIG. 6C, the memory cell transistors MC and the select gate transistors SG are formed on the semiconductor substrate 1.

Thereafter, the diffusion layers 9 and the inter layer dielectric 8 are formed. Furthermore, various contact plugs, inter layer dielectrics, via plugs, interconnect layers and the like are formed. In this way, the semiconductor device in FIGS. 2A and 2B is manufactured.

(2) Etching Rate of Silicon Oxide Film 3c

The etching rate of the silicon oxide film 3c of the first embodiment will be described with reference to FIG. 7.

Figure 7:
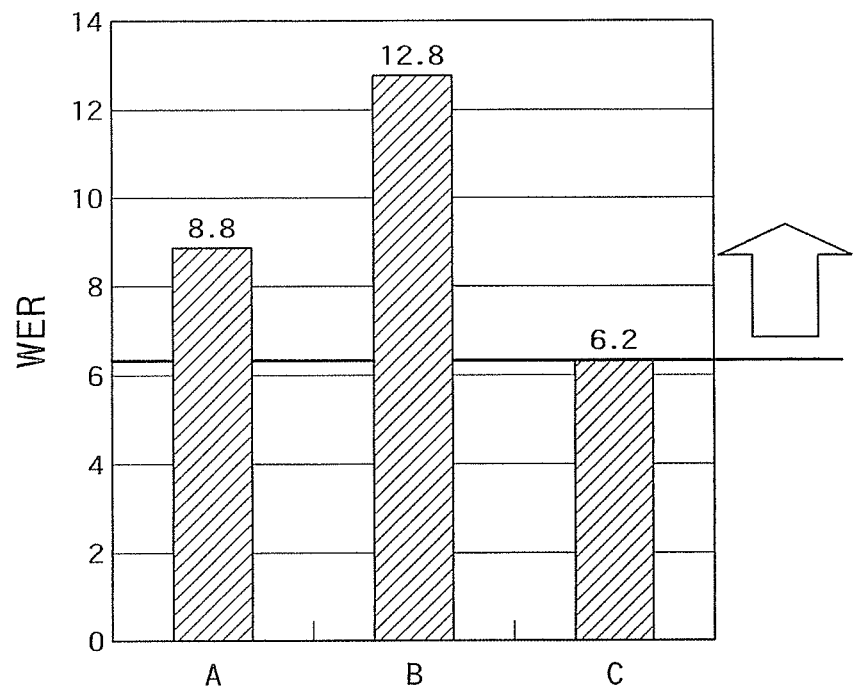
FIG. 7 is an example of a graph showing a wet etching rate (WER) of a silicon oxide film $3c$ of the first embodiment.

FIG. 7 is an example of a graph showing a wet etching rate (WER) of the silicon oxide film 3c of the first embodiment. The value of the WER in FIG. 7 is a value of a ratio to $SiO_2$ formed by thermal oxidation of Si.

Histograms A to C show the WER of a silicon oxide film formed from a polysilazane film. However, histogram A shows the WER of a silicon oxide film formed by the step in FIG. 4A, i.e. the first heat treatment, the dipping treatment and the second heat treatment. Histogram B shows the WER of a silicon oxide film formed only by the first heat treatment and the second heat treatment without the dipping treatment in the step in FIG. 4A. Histogram C shows the WER of a silicon oxide film formed by an annealing treatment other than microwave annealing in place of the second heat treatment in the step in FIG. 4A. Therefore, histogram A shows the WER of the silicon oxide film 3c of the first embodiment.

As is apparent from comparison of histograms A and B to histogram C, the WER is higher when microwave annealing is performed than when microwave annealing is not performed. Accordingly, in the case where a silicon oxide film is formed from a polysilazane film and the silicon oxide film is recessed to form an air gap, an air gap becomes easy to be formed if the silicon oxide film is formed from the polysilazane film by microwave annealing. Therefore, according to this embodiment, the air gap can be easily formed by forming the silicon oxide film 3c from the polysilazane film 3b by microwave annealing.

As is apparent from comparison of histogram A to histogram B, the WER is lower when the dipping treatment is performed before microwave annealing than when the dipping treatment is not performed. However, even when the dipping treatment is performed before microwave annealing, the WER is higher as compared to the case where microwave annealing is not performed. Therefore, according to this embodiment, the air gap becomes easier to be formed as compared to the case where microwave annealing is not performed.

Figure 8:
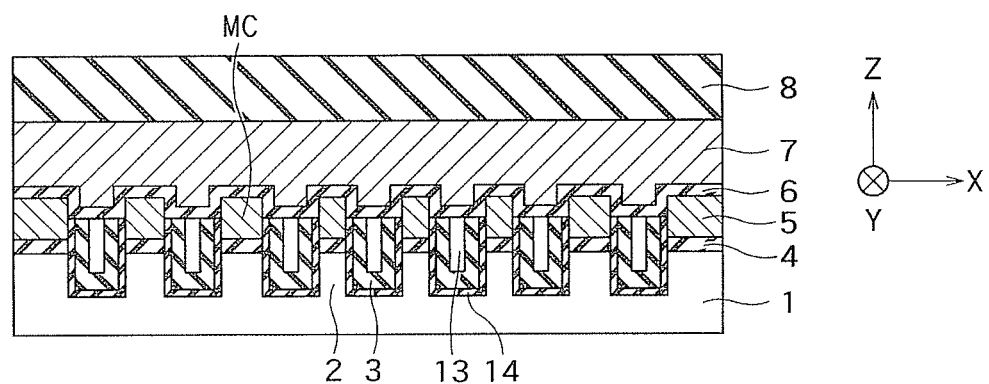
FIG. 8 is an example of a sectional view showing a structure of a semiconductor device of a modification of the first embodiment.

FIG. 8 is an example of a sectional view showing a structure of a semiconductor device of a modification of the first embodiment.

The semiconductor device in FIG. 8 includes, in addition to the components shown in FIGS. 2A and 2B, air gaps 13 and protective insulators 14 formed in the isolation trenches 3a. The protective insulators 14 are formed on the entire surface of the semiconductor substrate 1 before applying the PSZ coating solution in the step in FIG. 3C. In the step in FIG. 4C, wet etching of the isolation insulators 3 (silicon oxide films 3c) is performed for forming the air gaps 13 in the isolation trenches 3a, so that portions of the isolation insulators 3 in the isolation trenches 3a are removed. Thereafter, in the step in FIG. 5B, the second insulating layer 6 is formed on the entire surface of the semiconductor substrate 1 so that the air gaps 13 are left in the isolation trenches 3a. In this way, the semiconductor device in FIG. 8 is manufactured.

According to this embodiment, the WER of the silicon oxide film 3c can be increased by forming the silicon oxide film 3c from the polysilazane film 3b by microwave annealing, which makes it possible to easily form the air gaps 13.

The shape of each air gap 13 may be different from the shape shown in FIG. 8. Although the air gaps 13 in this embodiment are formed by wet etching of the silicon oxide film 3c after forming the silicon oxide film 3c, the polysilazane film 3b may be formed so that the air gaps 13 are formed at the time of forming the polysilazane film 3b.

(3) Semiconductor Manufacturing Apparatus of First Embodiment

An example of a semiconductor manufacturing apparatus of the first embodiment will be described with reference to FIG. 9.

Figure 9:
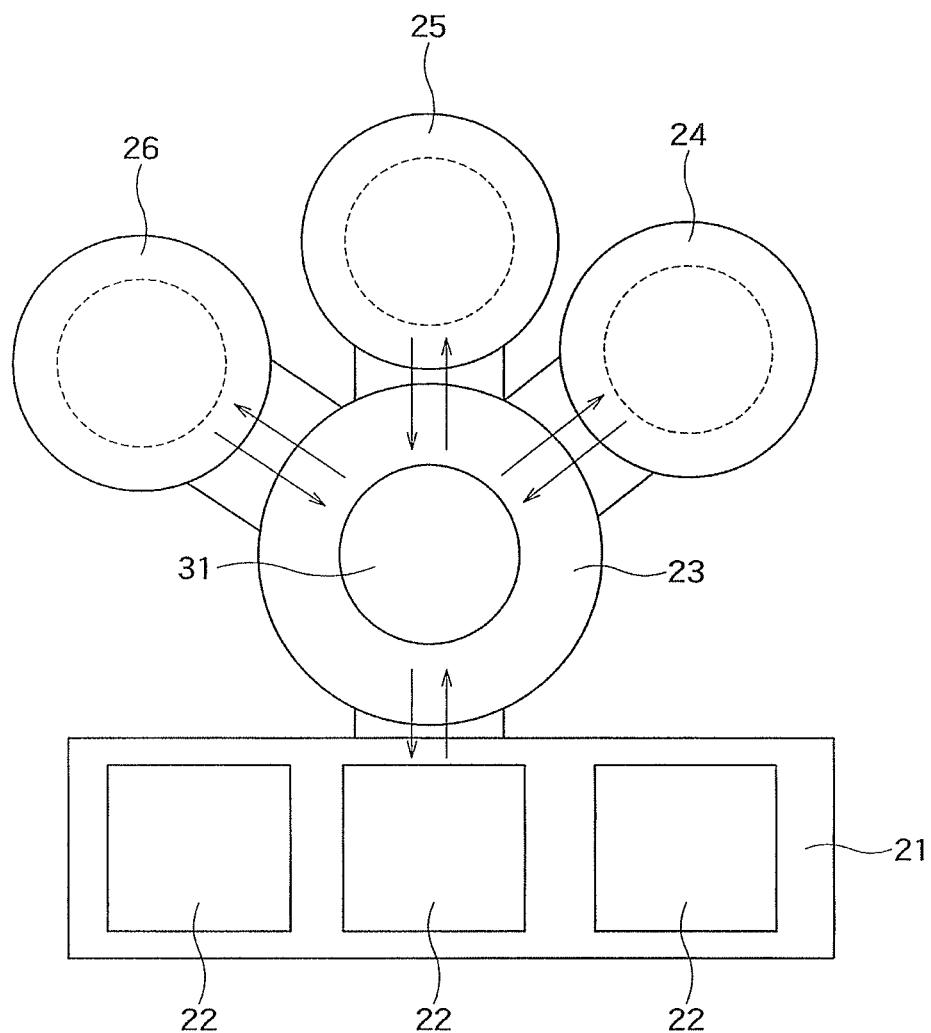
FIG. 9 is an example of a schematic view showing a structure of a semiconductor manufacturing apparatus of the first embodiment.

FIG. 9 is an example of a schematic view showing a structure of the semiconductor manufacturing apparatus of the first embodiment. The semiconductor manufacturing apparatus in FIG. 9 is used when the step in FIG. 4A is performed.

The semiconductor manufacturing apparatus in FIG. 9 includes an interface section 21 having a plurality of ports 22, a substrate transfer room 23, a liquid treatment chamber 24, a microwave annealing chamber 25 and an annealing chamber 26. The liquid treatment chamber 24 is an example of the polar molecule supplying chamber of the disclosure.

A semiconductor wafer 31 corresponds to the substrate just before carrying out the step in FIG. 4A. Therefore, the semiconductor wafer 31 includes the semiconductor substrate 1, the device regions 2, the first insulating layer 4, the first electrode layer 5, the hard mask layer 11 and the polysilazane film 3b.

The interface section 21, the liquid treatment chamber 24, the microwave annealing chamber 25 and the annealing chamber 26 are all connected to the substrate transfer room 23. Therefore, the semiconductor wafer 31 carried from the interface section 21 into the semiconductor manufacturing apparatus can be moved among chambers 24 to 26 without being carried to outside the semiconductor manufacturing apparatus. Movement of the semiconductor wafer 31 is performed by a robot in the substrate transfer room 23.

The semiconductor wafer 31 carried in the semiconductor manufacturing apparatus is first transferred into the annealing chamber 26. The annealing chamber 26 performs an annealing treatment other than microwave annealing. In the annealing chamber 26, the first heat treatment is performed for heating the semiconductor wafer 31.

The semiconductor wafer 31 is then transferred into the liquid treatment chamber 24. In the liquid treatment chamber 24, the dipping treatment for dipping the semiconductor wafer 31 in the liquid such as hot water or the chemical liquid, and the drying treatment for drying the semiconductor wafer 31 after the dipping treatment are performed. At this time, the drying treatment is performed to such a degree that the water molecules are left in the polysilazane film 3b.

The semiconductor wafer 31 is then transferred into the microwave annealing chamber 25. In the microwave annealing chamber 25, the second heat treatment is performed for heating the polysilazane film 3b containing the water molecules by a microwave. As a result, the silicon oxide film 3c is formed from the polysilazane film 3b. Thereafter, the semiconductor wafer 31 is carried to outside the semiconductor manufacturing apparatus from the interface section 21.

According to the semiconductor manufacturing apparatus of this embodiment, the step in FIG. 4A can be performed consistently in one apparatus. In this embodiment, the second heat treatment is carried out before the water molecules in the polysilazane film 3b vaporize after performing the dipping treatment and the drying treatment. According to the semiconductor manufacturing apparatus of this embodiment, these treatments can be performed consistently in one apparatus, and it is therefore possible to avoid such vaporization.

(4) Effects of First Embodiment

Effects of the first embodiment will be described.

As described above, the silicon oxide film 3c in this embodiment is formed from the polysilazane film 3b by the first heat treatment, the dipping treatment and the second heat treatment. In the second heat treatment, the polysilazane film 3b containing the water molecules is irradiated with a microwave to heat the polysilazane film 3b. Therefore, according to this embodiment, the silicon oxide film 3c excellent in insulation performance can be formed by the first and second heat treatments at low temperature.

In this embodiment, a coating film other than the polysilazane film 3b may be used. For example, a coating film containing silicon as similar to the polysilazane film 3b may be used. In this case, an insulator obtained from this coating film may be a silicon oxide film or may be a silicon-containing insulator other than the silicon oxide film.

This embodiment may be applied to an insulator other than the isolation insulators 3. For example, this embodiment may be applied to the inter layer dielectric 8. In this case, the inter layer dielectric 8 is formed from a polysilazane film by the first heat treatment, the dipping treatment and the second heat treatment. In this case, the spaces between transistors MC and SG are an example of a concave portion of the disclosure.

Figure 10:
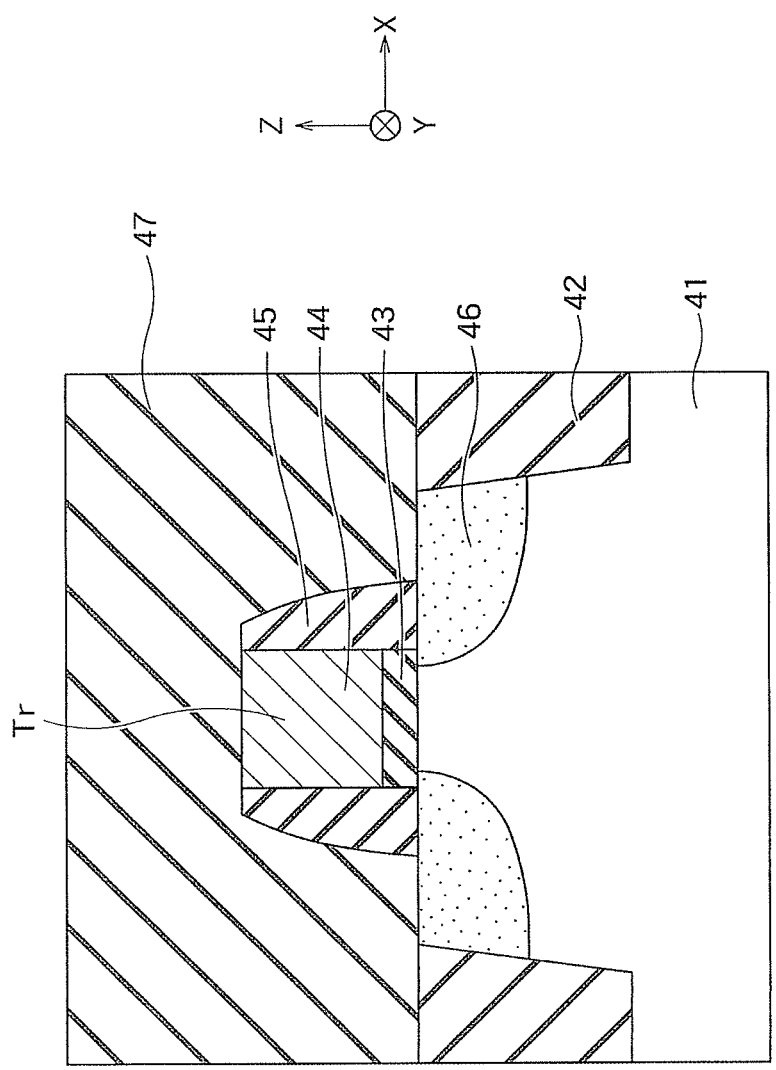
FIG. 10 is an example of a sectional view showing a structure of a semiconductor device of a modification of the first embodiment.

This embodiment can also be applied to a semiconductor device in FIG. 10. FIG. 10 is an example of a sectional view showing a structure of a semiconductor device of a modification of the first embodiment. The semiconductor device in FIG. 10 includes a semiconductor substrate 41, isolation insulators 42, a gate insulator 43, a gate electrode 44, sidewall insulators 45, source and drain diffusion layers 46 and an inter layer dielectric 47. Symbol Tr denotes a MOSFET.

According to this embodiment, the isolation insulators 42 or the inter layer dielectric 47 can be formed from a polysilazane film by the first heat treatment, the dipping treatment and the second heat treatment. In this case, the spaces between isolation trenches for isolation insulators 42 or between MOSFETs are an example of a concave portion of the disclosure.

(Second Embodiment)

Figure 11:
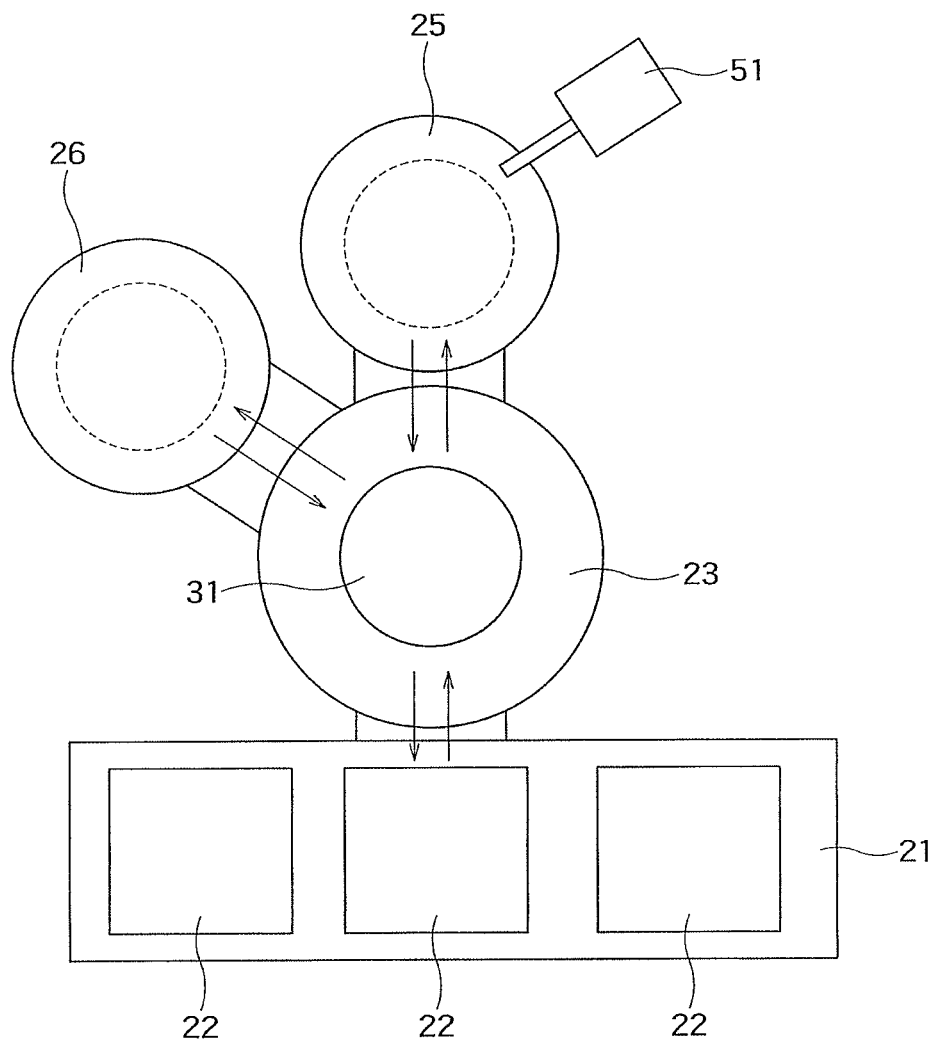
FIG. 11 is an example of a schematic view showing a structure of a semiconductor manufacturing apparatus of the second embodiment.

FIG. 11 is an example of a schematic view showing a structure of a semiconductor manufacturing apparatus of a second embodiment.

In the first embodiment, the second heat treatment is performed after exposing the polysilazane film 3b to hot water. In contrast, in the second embodiment, the second heat treatment is performed while exposing the polysilazane film 3b to water vapor. According to the second embodiment, the polysilazane film 3b can be sufficiently oxidized by microwave annealing at low temperature by causing the water molecules to be absorbed into the polysilazane film 3b, similarly to the first embodiment.

The semiconductor manufacturing apparatus in FIG. 11 includes a vaporizer 51 provided in the microwave annealing chamber 25 in place of the liquid treatment chamber 24. The vaporizer 51 generates water vapor and supplies the water vapor into the microwave annealing chamber 25. Therefore, in the microwave annealing chamber 25, the second heat treatment can be performed while exposing the polysilazane film 3b to the water vapor. As a result, the silicon oxide film 3c is formed from the polysilazane film 3b. The vaporizer 51 is an example of a polar molecule supplying apparatus of the disclosure.

The second heat treatment of this embodiment may be performed while exposing the polysilazane film 3b to a gas containing polar molecules other than the water molecules. Examples of such polar molecules include polar molecules containing oxygen atoms, for example, ozone molecules and hydrogen peroxide molecules. The temperature of the gas is set at, for example, 30 to 90° C.

Effects of the second embodiment will be described.

As described above, the silicon oxide film 3c in this embodiment is formed from the polysilazane film 3b by the first heat treatment and the second heat treatment. In the second heat treatment, the polysilazane film 3b is exposed to water vapor and simultaneously irradiated with a microwave to heat the polysilazane film 3b. Therefore, according to this embodiment, the silicon oxide film 3c excellent in insulation performance can be formed by the first and second heat treatments at a low temperature, similarly to the first embodiment.

In the microwave annealing chamber 25 of the second embodiment, the second heat treatment may be performed while exposing the polysilazane film 3b to hot water. In the chamber 24 of the first embodiment, water molecules may be caused to be absorbed into the polysilazane film 3b by exposing the polysilazane film 3b to water vapor. In these cases, effects comparable to those of the first and second embodiments can be obtained.

The microwave annealing chamber 25 of the first embodiment may include the vaporizer 51. In this case, the dipping treatment of the semiconductor wafer 31 can be performed, and the second heat treatment can be performed while exposing the polysilazane film 3b to water vapor. That is, both the dipping treatment and water vapor treatment can be performed. Consequently, the oxidation reaction of the polysilazane film 3b in the second heat treatment can be made to proceed further efficiently.

While certain embodiments have been described, these embodiments have been presented by way of example only, and are not intended to limit the scope of the inventions. Indeed, the novel methods and apparatuses described herein may be embodied in a variety of other forms; furthermore, various omissions, substitutions and changes in the form of the methods and apparatuses described herein may be made without departing from the spirit of the inventions. The accompanying claims and their equivalents are intended to cover such forms or modifications as would fall within the scope and spirit of the inventions.

The invention claimed is:

1. A method of manufacturing a semiconductor device, comprising:
    forming a concave portion on a surface of a substrate to be processed;
    forming a coating film on the substrate to embed the coating film in the concave portion;
    performing a first heat treatment for heating the coating film in an atmosphere including an oxidant which contains polar molecules; and
    performing a second heat treatment after the first heat treatment for heating the coating film by irradiating the coating film with a microwave after or while exposing the coating film to a liquid or a gas containing polar molecules.

2. The method of claim 1, wherein the coating film is a polysilazane film.

3. The method of claim 1, wherein the oxidant is water vapor.

4. The method of claim 1, wherein the first heat treatment heats the coating film by lamp annealing or laser annealing.

5. The method of claim 1, wherein the polar molecules contained in the liquid or the gas are water molecules, ozone molecules or hydrogen peroxide molecules.

6. The method of claim 1, wherein the second heat treatment heats the coating film at 200 to 500° C.

7. The method of claim 1, wherein a decomposition reaction in which the polar molecules decompose the coating film is generated in the second heat treatment.

8. The method of claim 1, wherein wet etching is performed after the second heat treatment to remove a portion of the coating film in the concave portion.

9. The method of claim 8, wherein an insulating layer is formed on the substrate after the wet etching to form an air gap in the concave portion.

10. The method of claim 1, wherein the liquid or the gas containing the polar molecules is water, a chemical liquid containing sulfuric acid and hydrogen peroxide, or water vapor.

11. The method of claim 1, wherein a drying treatment for drying the surface of the coating film so that the polar molecules are left in the coating film is performed between the exposure of the coating film to the liquid or the gas containing the polar molecules and the second heat treatment.

* * * * *